United States Patent
Moon et al.

(10) Patent No.: US 9,107,307 B2
(45) Date of Patent: Aug. 11, 2015

(54) RESIN COMPOSITION FOR PRINTED CIRCUIT BOARD, INSULATING FILM, PREPREG, AND PRINTED CIRCUIT BOARD

(71) Applicant: SAMSUNG ELECTRO-MECHANICS CO., LTD., Suwon (KR)

(72) Inventors: Jin Seok Moon, Suwon (KR); Hyun Jun Lee, Suwon (KR); Keun Yong Lee, Suwon (KR); Seong Hyun Yoo, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/831,767

(22) Filed: Mar. 15, 2013

(65) Prior Publication Data

US 2014/0147639 A1   May 29, 2014

(30) Foreign Application Priority Data

Nov. 23, 2012  (KR) .......................... 10-2012-0133836

(51) Int. Cl.
| | |
|---|---|
| B32B 3/00 | (2006.01) |
| H05K 1/03 | (2006.01) |
| C09D 163/00 | (2006.01) |
| C08L 67/03 | (2006.01) |
| C08J 5/24 | (2006.01) |
| C08L 63/00 | (2006.01) |
| H05K 3/46 | (2006.01) |

(52) U.S. Cl.
CPC ................ *H05K 1/0353* (2013.01); *C08J 5/24* (2013.01); *C08L 63/00* (2013.01); *C08L 67/03* (2013.01); *C09D 163/00* (2013.01); *H05K 3/4676* (2013.01); *C08J 2363/00* (2013.01); *H05K 1/0346* (2013.01); *H05K 2201/0129* (2013.01); *H05K 2201/0141* (2013.01); *H05K 2201/0209* (2013.01); *Y10T 428/24802* (2015.01)

(58) Field of Classification Search
CPC ..... H05K 1/353; H05K 1/373; C09D 163/00; C09D 167/02
See application file for complete search history.

(56) References Cited

U.S. PATENT DOCUMENTS

2014/0106147 A1*   4/2014   Lee et al. .................... 428/213

FOREIGN PATENT DOCUMENTS

| KR | 1020110108198 A | 10/2011 |
|---|---|---|
| WO | WO 0069232 | * 11/2000 |

* cited by examiner

*Primary Examiner* — Elizabeth Mulvaney
(74) *Attorney, Agent, or Firm* — Ladas & Parry, LLP

(57) ABSTRACT

Disclosed herein are a resin composition of a printed circuit board including a liquid crystal oligomer, an epoxy resin, and a phenolic curing agent having five or more functional groups, an insulating film and a prepreg manufactured using the resin composition, and a printed circuit board including the insulating film or the prepreg. The resin composition for a printed circuit board according to the present invention, and the insulating film and the prepreg manufactured using the same, may have low coefficient of thermal expansion, excellent heat resistance property, and a high glass transition temperature.

14 Claims, 1 Drawing Sheet

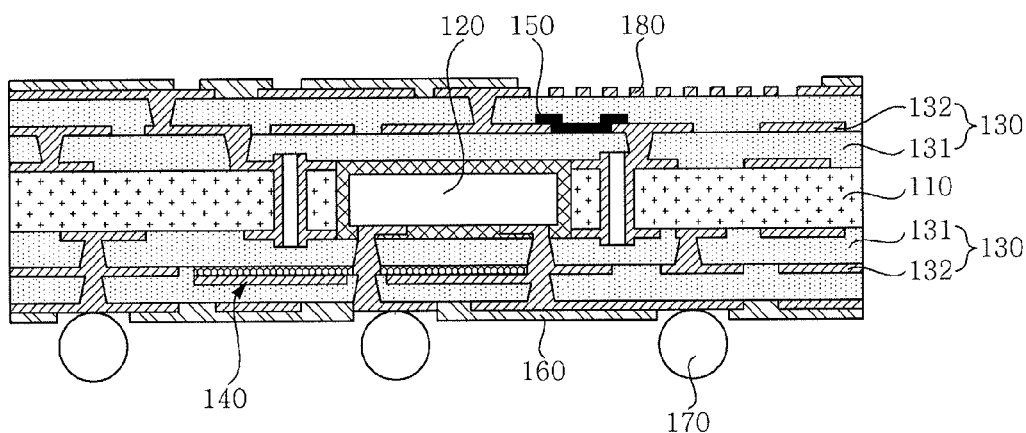

RESIN COMPOSITION FOR PRINTED CIRCUIT BOARD, INSULATING FILM, PREPREG, AND PRINTED CIRCUIT BOARD

CROSS REFERENCE TO RELATED APPLICATION

This application claims the benefit of Korean Patent Application No. 10-2012-0133836, filed on Nov. 23, 2012, entitled "Resin Composition for Printed Circuit Board, Insulating Film, Prepreg, and Printed Circuit Board", which is hereby incorporated by reference in its entirety into this application.

BACKGROUND OF THE INVENTION

1. Technical Field

The present invention relates to a resin composition for a printed circuit board, an insulating film, a prepreg, and a printed circuit board.

2. Description of the Related Art

As electronic devices have advanced and complicated functions have been required, a printed circuit board has gradually been light, thin, and miniaturized. In order to satisfy these demands, a wiring of a printed circuit has become more complicated, highly densified, and multi-functionalized. In addition, in the printed circuit board, as a buildup layer becomes multi-layered, fineness and high density of the wiring has been demanded. Electric, thermal, and mechanical properties required in the board as described above are important factors.

The printed circuit board is configured of copper mainly serving as circuit wiring and a polymer serving as an interlayer insulating material. In the polymer configuring an insulating layer as compared with copper, various properties, such as a coefficient of thermal expansion, a glass transition temperature, thickness-uniformity, and the like, are required. Particularly, the insulating layer should be manufactured so as to have a thin thickness.

As the circuit board has been thin, rigidity of the board itself has been lowered, such that a defect may be generated by a warpage phenomenon at the time of mounting components at a high temperature. In this case, a thermal expansion property and a heat resistance property of thermosetting polymer resin act as important factors. At the time of thermosetting, a structure of the polymer, a network between polymer resin chains configuring a composition for a board, and a cure density closely affect the heat expansion property and the heat resistance property.

Meanwhile, an epoxy resin composition including a liquid crystal oligomer has been disclosed in Patent Document 1. However, a network between a curing agent and a polymer resin was not sufficiently formed, such that a coefficient of thermal expansion was not sufficiently lowered so as to be suitable for a printed circuit board, and a glass transition temperature was not sufficiently raised.

PRIOR ART DOCUMENT (Patent Document 1) Korean Patent Laid-Open Publication No. 2011-0108198

SUMMARY OF THE INVENTION

It was confirmed that in a resin composition for a printed circuit board, a resin composition in which a liquid crystal oligomer, preferably a liquid crystal oligomer having a specific structure, an epoxy resin, preferably an epoxy resin having four or more epoxy functional groups, and a phenolic curing agent having five or more functional groups are combined, and a product using the resin composition have improved coefficient of thermal expansion and excellent thermal properties, and the present invention was completed based thereon.

The present invention has been made in an effort to provide a resin composition for a printed circuit board having low coefficient of thermal expansion and an improved glass transition temperature.

The present invention has been made in another effort to provide an insulating film manufactured using the resin composition to have low coefficient of thermal expansion and an improved glass transition temperature.

The present invention has been made in still another effort to provide a prepreg manufactured by impregnating the resin composition in a base to have low coefficient of thermal expansion and an improved glass transition temperature.

The present invention has been made in still another effort to provide a printed circuit board including the insulating film or the prepreg.

According to a first preferred embodiment of the present invention, there is provided a resin composition for a printed circuit board, the resin composition including: a liquid crystal oligomer; an epoxy resin; and a phenolic curing agent having five or more functional groups and represented by the following Chemical Formula 1.

[Chemical Formula 1]

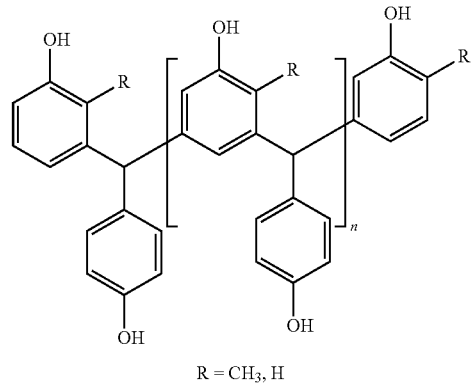

$R = CH_3, H$ n is an integer of 1 to 10.

According to a second preferred embodiment of the present invention, the resin composition described above may further include an inorganic filler.

The liquid crystal oligomer may be represented by the following Chemical Formula 2, 3, 4, or 5.

[Chemical Formula 2]
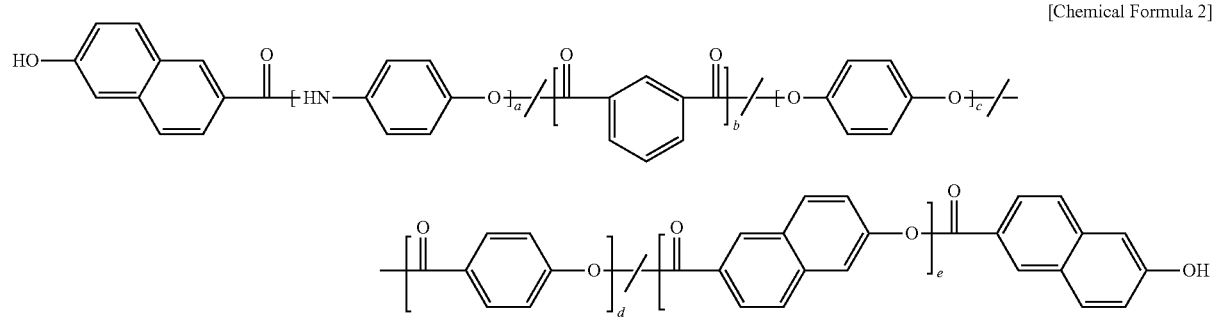
[Chemical Formula 3]
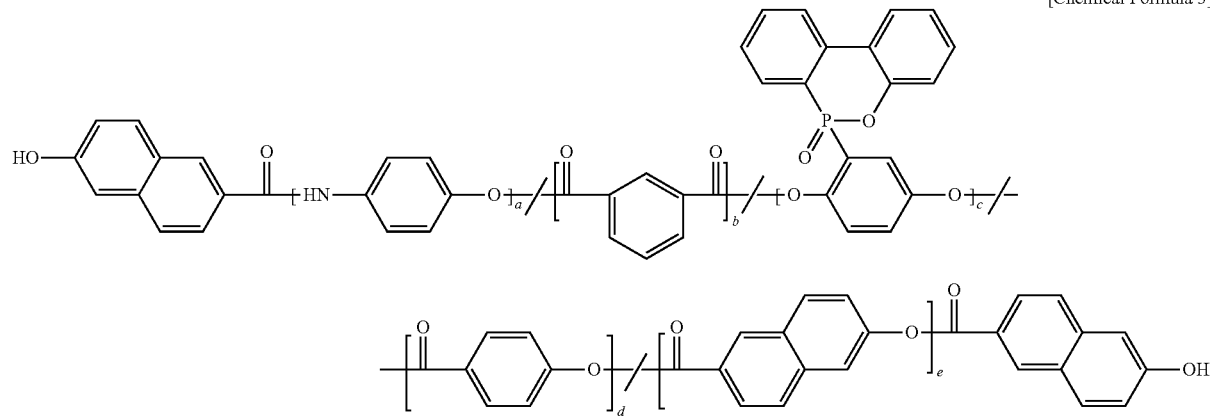
[Chemical Formula 4]
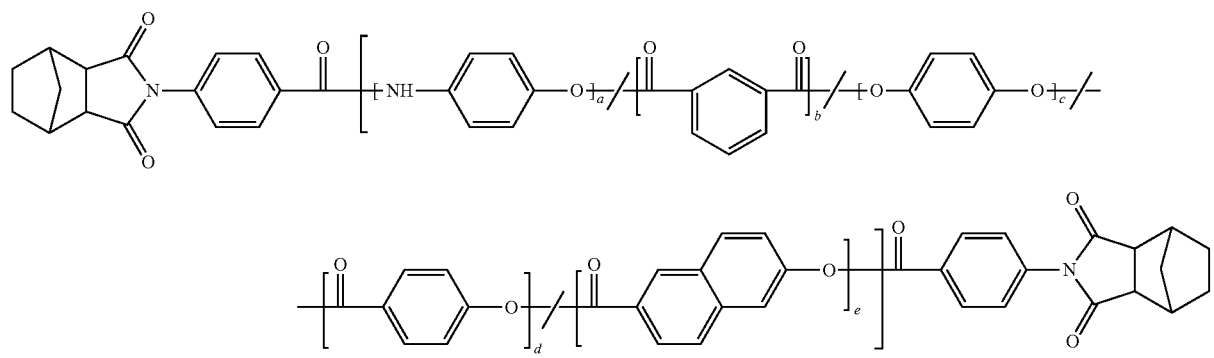
[Chemical Formula 5]
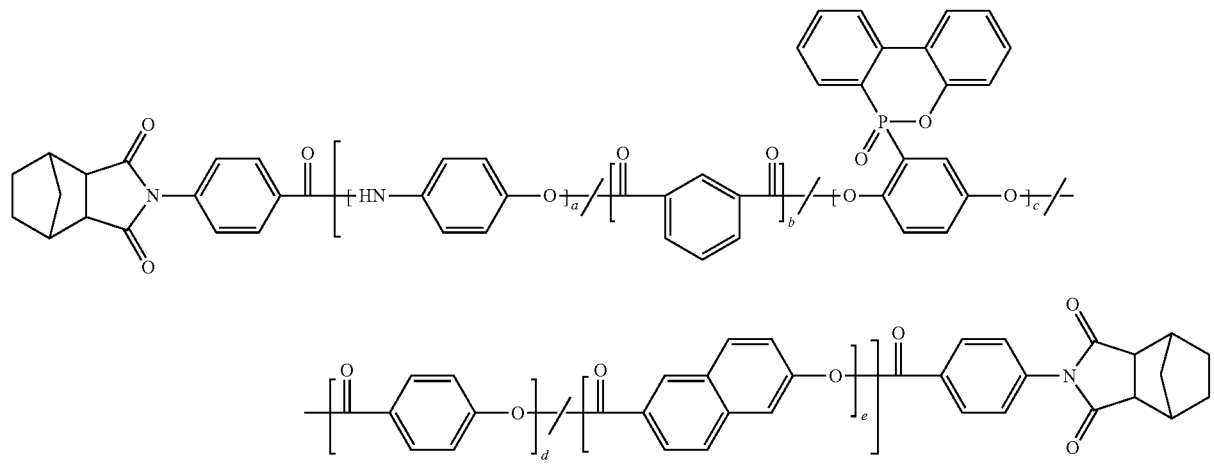

In Chemical Formulas 2 to 5, a is an integer of 13 to 26, b is an integer of 13 to 26, c is an integer of 9 to 21, d is an integer of 10 to 30, and e is an integer of 10 to 30.

The resin composition according to the first preferred embodiment of the present invention may contain 39 to 60 weight % of the liquid crystal oligomer, 39 to 60 weight % of the epoxy resin, and 0.1 to 1 weight % of the phenolic curing agent having five or more functional groups.

The resin composition according to the second preferred embodiment of the present invention may contain 9 to 30 weight % of the liquid crystal oligomer, 9 to 30 weight % of the epoxy resin, 0.01 to 0.5 weight % of the phenolic curing agent having five or more functional groups, and 50 to 80 weight % of the inorganic filler.

The liquid crystal oligomer may have a number average molecular weight of 2,500 to 6,500.

The epoxy resin may be at least one selected from a naphthalene type epoxy resin, a bisphenol A type epoxy resin, a phenol novolac epoxy resin, a cresol novolac epoxy resin, a rubber modified epoxy resin, and a phosphorous type epoxy resin.

The epoxy resin may have four or more epoxy functional groups.

The inorganic filler may be at least one selected from a group consisting of silica, alumina, barium sulfate, talc, clay, mica powder, aluminum hydroxide, magnesium hydroxide, calcium carbonate, magnesium carbonate, magnesium oxide, boron nitride, aluminum borate, barium titanate, calcium titanate, magnesium titanate, bismuth titanate, titanium oxide, barium zirconate, and calcium zirconate.

The resin composition may further include at least one curing accelerator selected from a metal based curing accelerator, an imidazole based curing accelerator, and an amine based curing accelerator.

The resin composition may further include at least one thermoplastic resin selected from a phenoxy resin, a polyimide resin, a polyamideimide (PAI) resin, a polyetherimide (PEI) resin, a polysulfone (PS) resin, a polyethersulfone (PES) resin, a polyphenyleneether (PPE) resin, a polycarbonate (PC) resin, a polyetheretherketone (PEEK) resin, a polyester resin.

According to a third preferred embodiment of the present invention, there is provided an insulating film made of the resin composition described above.

According to a fourth preferred embodiment of the present invention, there is provided a prepreg manufactured by impregnating the resin composition described above into a base.

According to a fifth preferred embodiment of the present invention, there is provided a printed circuit board comprising the insulating film described above.

According to a sixth preferred embodiment of the present invention, there is provided a printed circuit board comprising the prepreg described above.

BRIEF DESCRIPTION OF THE DRAWINGS

The above and other objects, features and advantages of the present invention will be more clearly understood from the following detailed description taken in conjunction with the accompanying drawings, in which:

FIG. 1 is a cross-sectional view of a general printed circuit board capable of using a resin composition according to the preferred embodiment of the present invention.

DESCRIPTION OF THE PREFERRED EMBODIMENTS

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

FIG. 1 is a cross-sectional view of a general printed circuit board capable of using a resin composition according to the preferred embodiment of the present invention. Referring to FIG. 1, a printed circuit board 100 may be an embedded board on which electronic components are embedded. More specifically, the printed circuit board 100 may include an insulator or a prepreg 110 provided with a cavity, an electronic component 120 disposed in the cavity, and a buildup layer 130 disposed on at least one of upper and lower surfaces of the insulator or the prepreg 110 including the electronic component 120. The buildup layer 130 may include an insulating layer 131 disposed on at least one of upper and lower surfaces of the insulator 110 and a circuit layer 132 disposed on the insulating layer 131 and connecting between layers.

Here, the electronic component 120 may be, for example, an active device such as a semiconductor device. In addition, the printed circuit board 100 may not include only one electronic component 120 embedded thereon but further include at least one additional electronic component, for example, a capacitor 140, a resistance device 150, and the like. In the preferred embodiment of the present invention, a kind or the number of electronic component is not limited thereto. Here, the insulator or the prepreg 110 and the insulating layer 131 may serve to insulate the circuit layers from each other or to insulate the electronic components from each other and simultaneously serve as a structural material for maintaining rigidity of a package.

In this case, when a wiring density of the printed circuit board 100 is increased, the insulator or the prepreg 110 and the insulating layer 131 need to have a low permittivity property in order to simultaneously reduce noise between the circuit layers and parasitic capacitance, and have a low dielectric loss property in order to improve an insulation property.

As described above, at least one of the insulator or the prepreg 110 and the insulating layer 131 needs to have rigidity while reducing the permittivity and the dielectric loss. According to the present invention, in order to secure rigidity by reducing a thermal expansion rate and raising a glass transition temperature, the insulating layer may be made of a resin composition containing a liquid crystal oligomer, preferably, a liquid crystal oligomer represented by the following Chemical Formulas 2 to 5; an epoxy resin; and a phenolic curing agent having five or more functional groups and represented by Chemical Formula 1.

In addition, the insulating layer or the prepreg may be made of a resin composition containing a liquid crystal oligomer, preferably, a liquid crystal oligomer represented by the following Chemical Formulas 2 to 5; an epoxy resin; a phenolic curing agent having five or more functional groups and represented by Chemical Formula 1; and an inorganic filler.

[Chemical Formula 1]
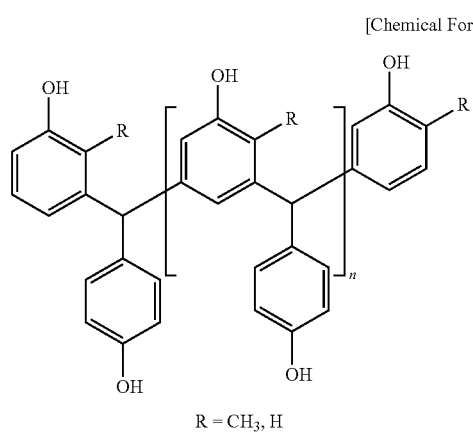
R = CH₃, H
n is an integer of 1 to 10.
[Chemical Formula 2]
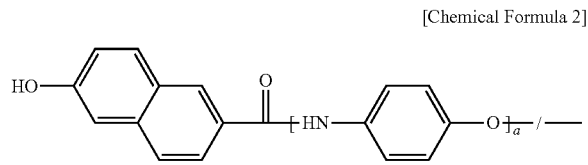
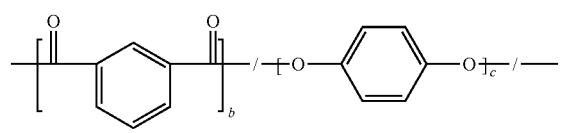
[Chemical Formula 3]
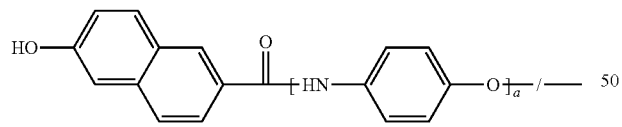
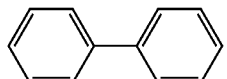
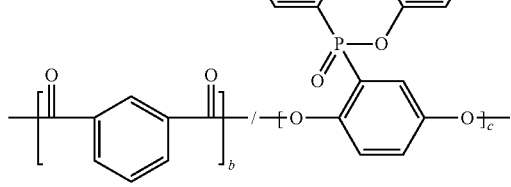
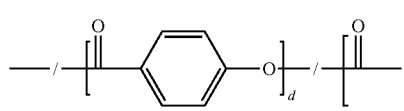
-continued
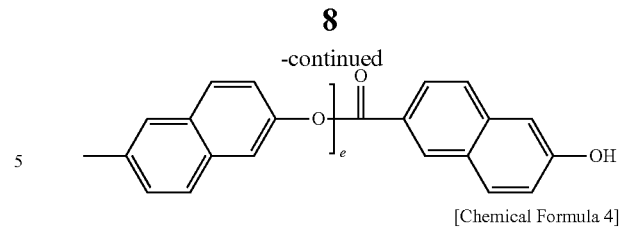
[Chemical Formula 4]
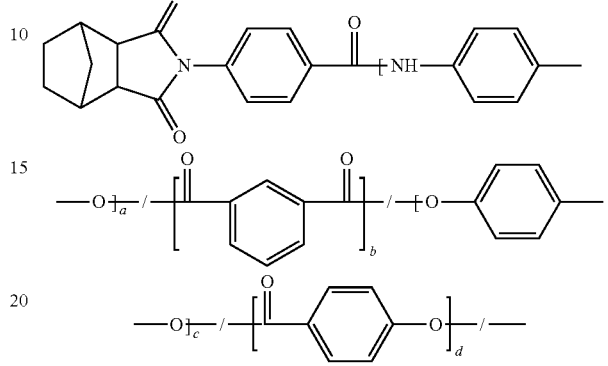
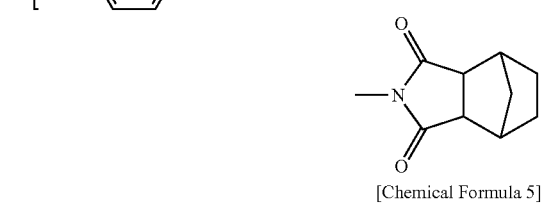
[Chemical Formula 5]
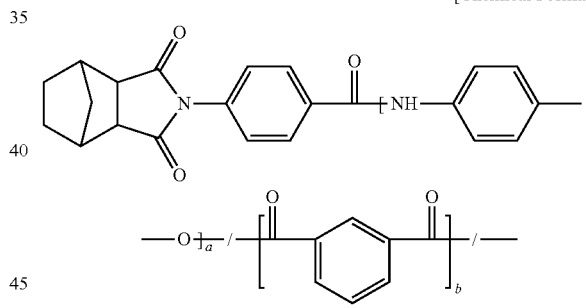
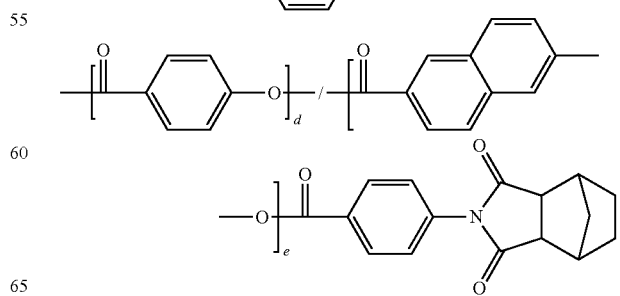

In Chemical Formulas 2 to 5, a is an integer of 13 to 26, b is an integer of 13 to 26, c is an integer of 9 to 21, d is an integer of 10 to 30, and e is an integer of 10 to 30.

Liquid Crystal Oligomer

The liquid crystal oligomer, preferably, the liquid crystal oligomer represented by Chemical Formulas 2 to 5 includes ester groups at both ends of the main chain thereof in order to improve dielectric loss tangent and dielectric constant and naphthalene group for crystallization, and may include a phosphorus component for imparting flame retardancy.

The liquid crystal oligomer may have a number average molecular weight of preferably 2,500 to 6,500 g/mol, more preferably 3,000 to 6,000 g/mol, and most preferably 4,500 to 5,500 g/mol. In the case in which the number average molecular weight of the liquid crystal oligomer is less than 2,500 g/mol, mechanical properties may be weak, and in the case in which the number average molecular weight is more than 6,500 g/mol, solubility may be reduced.

In the case of preparing the resin composition that does not contain the inorganic filler, a content of the liquid crystal oligomer may be preferably 39 to 60 weight %, and more preferably 45 to 55 weight %. When the content is less than 39 weight %, effects of reducing the coefficient of thermal expansion and improving the glass transition temperature may be insignificant, and when the content is more than 60 weight %, the mechanical properties may be deteriorated.

On the other hand, in the case of preparing the resin composition containing the inorganic filler, the content of the liquid crystal oligomer may be 9 to 30 weight %. When the content is less than 9 weight %, effects of reducing the coefficient of thermal expansion and improving the glass transition temperature may be insignificant, and when the content is more than 30 weight %, the mechanical properties may be deteriorated.

Epoxy Resin

The resin composition according to the present invention contains the epoxy resin in order to improve a handling property as an adhesive film of the resin composition after drying. The epoxy resin is not particularly limited but means a resin having at least one epoxy group, preferably at least two epoxy groups, more preferably at least four epoxy groups, in its molecule.

The epoxy resin used in the present invention may be preferably an epoxy resin containing a naphthalene group as shown in Chemical Formula 6 or an aromatic amine epoxy resin as shown in Chemical Formula 7.

[Chemical Formula 6]

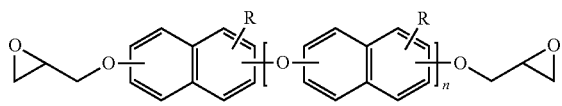

In Chemical Formula 6, R is an alkyl group having carbon atoms of 1 to 20, and n is an integer of 0 to 20.

[Chemical Formula 7]

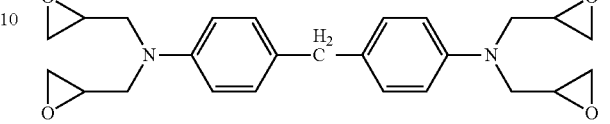

However, the epoxy resin used in the present invention is not particularly limited to the epoxy resin represented by Chemical Formula 6 or 7. Examples of the epoxy resin include a bisphenol A type epoxy resin, a bisphenol F-type epoxy resin, a bisphenol S-type epoxy resin, a phenol novolac type epoxy resin, an alkylphenol novolac type epoxy resin, a biphenyl type epoxy resin, an aralkyl type epoxy resin, a dicyclopentadiene-type epoxy resin, a naphthalene type epoxy resin, a naphthol-type epoxy resin, epoxy resins of condensates of phenols and aromatic aldehyde having a phenolic hydroxyl group, a biphenyl aralkyl type epoxy resin, a fluorene epoxy resin, a xanthene type epoxy resin, triglycidyl isocyanurate, a rubber modified epoxy resin, and a phosphorous type epoxy resin, or the like. Among them, the naphthalene type epoxy resin, the bisphenol A type epoxy resin, the phenol novolac epoxy resin, the cresol novolac epoxy resin, the rubber modified epoxy resin, and the phosphorous type epoxy resin may be preferable. One kind of epoxy resin or a mixture of at least two kinds thereof may be used.

In the case of preparing the resin composition that does not contain the inorganic filler, a content of the epoxy resin may be preferably 39 to 60 weight %. When the content is less than 39 weight %, the handling property may be deteriorated, and when the content is more than 60 weight %, contents of other components may be relatively reduced, such that there is almost no effect of improving the dielectric loss tangent, the dielectric constant, and the thermal expansion efficient.

In the case of preparing the resin composition containing the inorganic filler, a content of the epoxy resin may be preferably 9 to 30 weight %. When the content is less than 9 weight %, the handling property may be deteriorated, and when the content is more than 30 weight %, contents of other components may be relatively reduced, such that there is almost no effect of improving the dielectric loss tangent, the dielectric constant, and the thermal expansion efficient.

Phenolic Curing Agent Having Five or More Functional Groups

Meanwhile, the resin composition according to the present invention may contain the phenolic curing agent having five or more functional groups and represented by Chemical Formula 1 in order to further improve the coefficient of thermal expansion and thermal property.

[Chemical Formula 1]

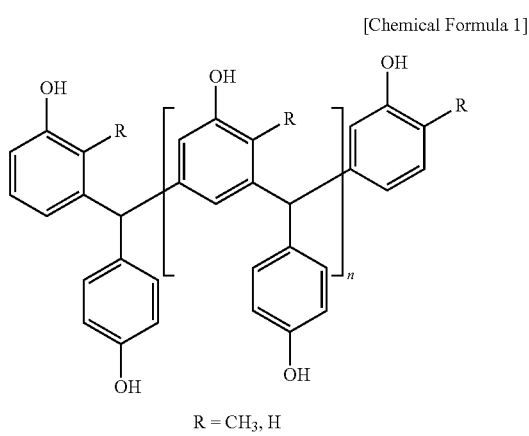

R = CH₃, H n is an integer of 1 to 10.

A hydroxy group of the phenolic curing agent having five or more functional groups in the resin composition according to the present invention reacts with the epoxy group of the epoxy resin at the time of a thermal curing reaction to configure a network in which the liquid crystal oligomer, the epoxy resin, the phenolic curing agent having five or more functional groups are connected with each other. That is, according to the present invention, among various curing agents, the phenolic curing agent having five or more functional groups and excellent reactivity with the liquid crystal oligomer having a specific structure as described above and the epoxy resin is selected, such that the network in which they are connected with each other. Therefore, a thermal expansion of the resin composition may be reduced, and high heat resistance property may be exhibited.

In the case of preparing the resin composition that does not contain the inorganic filler, a content of the phenolic curing agent having five or more functional groups is preferably 0.1 to 1 weight %. When the content is less than 0.1 weight %, a curing rate may be reduced, and when the content is more than 1 weight %, an unreacted curing agent may remain after reaction, such that a moisture absorption rate of the insulating film or the prepreg may increase, thereby deteriorating electrical properties.

On the other hand, in the case of preparing the resin composition containing the inorganic filler, the content of the phenolic curing agent having five or more functional groups is preferably 0.01 to 0.5 weight %. When the content is less than 0.01 weight %, the curing rate may be reduced, and when the content is more than 0.5 weight %, the unreacted curing agent may remain after the reaction, such that the moisture absorption rate of the insulating film or the prepreg may increase, thereby deteriorating the electrical properties.

Inorganic Filler

The resin composition according to the present invention further contains the inorganic filler in order to reduce the coefficient of thermal expansion (CTE) of the epoxy resin. The inorganic filler is used to reduce the coefficient of thermal expansion, and a content of the inorganic filler based on the resin composition may be different according to the required characteristics in consideration of a use of the resin composition, or the like, but may be preferable 50 to 80 weight %. When the content is less than 50 weight %, the dielectric loss tangent may be decreased and the thermal expansion rate may be increased, and when the content is more than 80 weight %, adhesion strength may be reduced.

As a specific example of the inorganic filler used in the present invention, there are silica, alumina, barium sulfate, talc, clay, mica powder, aluminum hydroxide, magnesium hydroxide, calcium carbonate, magnesium carbonate, magnesium oxide, boron nitride, aluminum borate, barium titanate, calcium titanate, magnesium titanate, bismuth titanate, titanium oxide, barium zirconate, calcium zirconate, and the like. Among them, one kind or a combination of at least two kinds may be used. Particularly, the silica having a low dielectric loss tangent may be preferable.

In addition, when an average particle size of the inorganic filler is more than 5 μm, it may be difficult to stably form a fine pattern at the time of forming a circuit pattern on a conductive layer. Therefore, the average particle size may be preferably 5 μm or less. Further, the inorganic filler may be surface-treated with a surface treating agent such as a silane coupling agent, or the like, in order to improve a moisture resistance property. The silica having a diameter of 0.2 to 2 μm may be more preferable.

Curing Accelerator

The resin composition according to the present invention may selectively contain a curing accelerator to effectively perform the curing. As the curing accelerator used in the present invention, there are a metal based curing accelerator, an imidazole based curing accelerator, an amine based curing accelerator, and the like. Among them, one kind or a combination of at least two kinds may be added as a general content used in the art.

The metal based curing accelerator is not particularly limited but may be, for example, an organic metal complex or an organic metal salt of a metal such as cobalt, copper, zinc, iron, nickel, manganese, tin, or the like. Specific examples of the organic metal complex may include an organic cobalt complex such as cobalt (II) acetylacetonate, cobalt (III) acetylacetonate, or the like, an organic copper complex such as copper (II) acetylacetonate, or the like, an organic zinc complex such as zinc (II) acetylacetonate, or the like, an organic iron complex such as Fe (III) acetylacetonate, or the like, an organic nickel complex such as nickel (II) acetylacetonate, or the like, an organic manganese complex such as manganese (II) acetylacetonate, or the like. Specific examples of the organic metal salt may include zinc octylate, tin octylate, zinc naphthenate, cobalt naphthenate, tin stearate, zinc stearate, or the like. As the metal base curing accelerator, cobalt (II) acetylacetonate, cobalt (III) acetylacetonate, zinc (II) acetylacetonate, zinc naphthenate, Fe (III) acetylacetonate may be preferable in view of curability and solubility in solvent. Particularly, cobalt (II) acetylacetonate and zinc naphthenate may be preferable. One kind of metal based curing accelerator or a combination of at least two kinds thereof may be used.

The imidazole based curing accelerator is not particularly limited but may be an imidazole compound such as 2-methyl imidazole, 2-undecyl imidazole, 2-heptadecyl imidazole, 1,2-dimethyl imidazole, 2-ethyl-4-methyl imidazole, 2-phenyl imidazole, 2-phenyl-4-methyl imidazole, 1-benzyl-2-methyl imidazole, 1-benzyl-2-phenyl imidazole, 1-cyanoethyl-2-methyl imidazole, 1-cyanoethyl-2-undecyl imidazole, 1-cyanoethyl-2-ethyl-4-methyl imidazole, 1-cyanoethyl-2-phenyl imidazole, 1-cyanoethyl-2-undecyl imidazolium trimellitate, 1-cyanoethyl-2-phenyl imidazolium trimellitate, 2,4-diamino-6-[2'-methyl-imidazolyl-(1')]-ethyl-s-triazine, 2,4-diamino-6-[2'-undecyl imidazolyl-(1')]ethyl-s-triazine, 2,4-diamino-6-[2'-ethyl-4'-methyl imidazolyl-(1')]-ethyl-s-triazine, 2,4-diamino-6-[2'-methyl imidazolyl-(1')]ethyl-s-triazine isocyanulic acid adduct, 2-phenyl imidazole isocyanulic acid adduct, 2-phenyl-4,5-dihydroxy methyl imidazole, 2-phenyl-4-methyl-5-hydroxy methyl imidazole, 2,3-dihydroxy-1H-pyrrolo[1,2-a]benzimidazole, 1-dodecyl-2-methyl-3-benzylimidazolium chloride, 2-methyl imidazoline, 2-phenyl imidazoline, or the like, and an adduct of the imidazole compound and the epoxy resin. One kind of imidazole based curing accelerator or a combination of at least two kinds thereof may be used.

The amine based curing agent is not particularly limited but may be trialkylamine such as triethylamine, tributylamine, or the like, and an amine compound 4-dimethylaminopyridine, benzyldimethylamine, 2,4,6-tris(dimethyaminomethyl)phenol, 1,8-diazabicyclo(5,4,0)-undecence (hereinafter, referred to as "DUB"), or the like. One kind of amine based curing accelerator or a combination of at least two kinds thereof may be used.

Thermoplastic Resin

The resin composition according to the present invention may selectively contain a thermoplastic resin in order to improve a film property of the resin composition and mechanical property of cured products. An example of the thermoplastic resin may include a phenoxy resin, a polyimide resin, a polyamideimide (PAI) resin, a polyetherimide (PEI) resin, a polysulfone (PS) resin, a polyethersulfone (PES) resin, a polyphenyleneether (PPE) resin, a polycarbonate (PC) resin, a polyetheretherketone (PEEK) resin, a polyester resin, or the like. One kind of thermoplastic resin or a mixture of at least two thereof may be used. The thermoplastic resin may have a weight average molecular weight of 5,000 to 200,000. In the case in which the weight average molecular weight is less than 5,000, a film forming property may not be sufficiently exhibited, and in the case in which the weight average molecular weight is more than 200,000, compatibility with the liquid crystal oligomer and the epoxy resin may not be sufficient, surface unevenness may be increased after curing, and formation of a high density fine pattern may be difficult. Specifically, the weight average molecular weight may be measured using LC-9A/RID-6A manufactured by Shimadzu Corporation as a measuring device, Shodex K-800P/K-804L/K-804L manufactured by Showa Denko K.K. as columns, and chloroform ($CHCl_3$), or the like, as a mobile phase at a column temperature of 40° C., and calculated using a calibration curve of standard polystyrene.

In the case of adding the thermoplastic resin to the resin composition according to the present invention, a content of the thermoplastic resin in the resin composition is not particularly limited but may be preferably 0.1 to 10 weight %, more preferably, 1 to 5 weight % based on 100 weight % of non-volatile component in the resin composition. When the content of the thermoplastic resin is less than 0.1 weight %, the film forming property and an effect of improving mechanical strength may not be exhibited, and when the content is more than 10 weight %, melt viscosity may be increased, and surface roughness of the insulating layer after a wet roughening process may be increased.

The insulating resin composition according to the present invention may be mixed in the presence of an organic solvent. As the organic solvent, 2-methoxy ethanol, acetone, methyl ethyl ketone, cyclohexanone, ethyl acetate, butyl acetate, cellosolve acetate, propylene glycol monomethyl ether acetate, ethylene glycol monobutyl ether acetate, cellosolve, butyl cellosolve, carbitol, butyl carbitol, xylene, dimethyl formamide, and dimethyl acetamide may be used in consideration of the resin and other additives used in the present invention, but the present invention is not limited thereto.

It may be preferable in view of manufacturing an insulating film that a viscosity of the resin composition according to the present invention is preferably 1000 to 2000 cps in the case in which the inorganic filler is not contained and is 700 to 1500 cps in the case in which the inorganic filler is contained, and the resin composition may have a property of maintaining a appropriate viscosity at room temperature. The viscosity of the resin composition may be adjusted by changing a content of a solvent. The non-voltaic component except for the solvent may be 30 to 70 weight % of the resin composition. In the case in which the viscosity of the resin composition is out of the above-mentioned range, it may be difficult to form the insulating film, or although the insulating film is formed, it may be difficult to mold a member.

In addition, in the case of using copper foil (12 μm), peel strength of the insulating film may be 1.0 kN/m or more. The insulating film made of the resin composition according to the present invention may have the coefficient of thermal expansion (CTE) of 5 to 50 ppm/° C., preferably 15 to 45 ppm/° C. when the inorganic filler is not contained. In addition, the glass transition temperature Tg may be 200 to 300° C., preferably 210 to 270° C.

In addition, the resin composition according to the present invention may further contain other leveling agents and/or flame retardant agent that are known in the art by those skilled in the art without departing from the scope and spirit of the invention, as needed.

The insulating resin composition according to the present invention may be manufactured as a dry film in a semi-solid state by any general method known in the art. For example, the insulating resin composition may be manufactured and dried in a film shape using a roller coater, a curtain coater, or the like, and then the dried resin composition may be applied onto a substrate to thereby be used as an insulating layer (or an insulating film) or a prepreg at the time of manufacturing a multi-layer printed circuit board by a build-up process. This insulating film or the prepreg may have a coefficient of thermal expansion (CTE) of 50 ppm/° C. or less.

As described above, after the resin composition according to the present invention is impregnated into a base such as glass fiber and then cured to manufacture the prepreg, a copper foil is laminated thereon to obtain a copper clad laminate (CCL). In addition, the insulating film made of the resin composition according to the present invention is laminated on the copper clad laminate (CCL) used to manufacture the multi-layer printed circuit board to thereby be used to manufacture the multi-layer printed circuit board. For example, the insulating film made of the insulating resin composition is laminated on an inner circuit board subjected to pattern processing and then cured at 80 to 110° C. for 20 to 30 minutes, followed by performing a desmear process. Next, a circuit layer is formed by an electroplating process, thereby making it possible to manufacture the multi-layer printed circuit board.

Hereinafter, the present invention will be described with reference to Examples and Comparative Examples in detail, but the present invention is not limited thereto.

PREPARATION EXAMPLE 1

Preparation of Liquid Crystal Oligomer 218.26 g of 4-aminophenol (2.0 mol), 415.33 g of isophthalic acid (2.5 mol), 276.24 g of 4-hydroxy benzoic acid (2.0 mol), 282.27 g of 6-hydroxy-2-naphthoic acid (1.5 mol), 648.54 g of 9,10-dihydroxy-9-oxa-10-phosphaphenanthrene-10-oxide (DOPO, 2.0 mol), and 1531.35 g of acetic anhydride (15.0 mol) were added in a 20 L glass reactor. After the atmosphere in the reactor was sufficiently substituted with nitrogen gas, a temperature in the reactor was raised to 230° C. under nitrogen gas flow, and the mixture was refluxed for 4 hours while maintaining the temperature. 188.18 g of 6-hydroxy-2-naphthoic acid (1.0 mol) for end capping was additionally added thereto, followed by removing acetic acid and unreacted acetic anhydride, which were residual products, thereby preparing a liquid crystal oligomer having a molecular weight of 4500 and represented by Chemical Formula 3.

EXAMPLE 1

1400 g of silica having an average particle size distribution of 0.2 to 1 μm was dispersed in 2-methoxy ethanol to prepare silica slurry having a concentration of 70 weight %. Next, 500 g of a bisphenol F type tetrafunctional epoxy resin (N,N,N',N'-tetraglycidyl-4,4'-methylenebisbenzenamine) having an average epoxy equivalent of 200 was added to the prepared silica slurry and stirred at 300 rpm and room temperature so as to be dissolved, thereby preparing a mixture. Thereafter, 5 g of a phenolic curing agent represented by Chemical Formula 1 and 500 g of the liquid crystal oligomer prepared in Preparation Example 1 and dissolved in dimethylacetamide were added to the prepared mixture and additionally stirred at 300 rpm for 1 hour, thereby preparing a resin composition. The prepared resin composition was applied onto a shiny surface of a copper foil at a thickness of 100 μm in a doctor blade scheme to manufacture a film. The manufactured film was dried at room temperature for 2 hours, dried in a vacuum oven at 80° C. for 1 hour, and then dried at 110° C. for 1 hour, thereby obtaining a B-stage film. The obtained B-stage film was completely cured using vacuum press. In this case, the maximum temperature was 230° C., and the maximum pressure was 2 MPa.

EXAMPLE 2

The same processes were performed as those in Example 1 except that silica was not used.

COMPARATIVE EXAMPLE 1

1400 g of silica having an average particle size of 0.2 to 1 μm was dispersed in 2-methoxy ethanol to prepare silica slurry having a concentration of 70 weight %. Next, 500 g of bisphenol F type tetrafunctional epoxy resin (N,N,N',N'-tetraglycidyl-4,4'-methylenebisbenzenamine) having an average epoxy equivalent of 100 to 300 was added to the prepared silica slurry and stirred at 300 rpm and room temperature so as to be dissolved, thereby preparing a mixture. Thereafter, 5 g of a dicyandiamide curing agent and 500 g of the liquid crystal oligomer prepared in Preparation Example 1 and dissolved in dimethylacetamide were added to the prepared mixture and additionally stirred at 300 rpm for 1 hour, thereby preparing a resin composition. The prepared resin composition was applied onto a shiny surface of a copper foil at a thickness of 100 μm in a doctor blade scheme. The manufactured film was dried at room temperature for 2 hours, dried in a vacuum oven at 80° C. for 1 hour, and then dried at 110° C. for 1 hour, thereby obtaining a B-stage film. The obtained B-stage film was completely cured using vacuum press. In this case, the maximum temperature was 230° C., and the maximum pressure was 2 MPa.

COMPARATIVE EXAMPLE 2

1400 g of silica having an average particle size of 0.2 to 1 μm was dispersed in 2-methoxy ethanol to prepare silica slurry having a concentration of 70 weight %. Next, 500 g of bisphenol F type tetrafunctional epoxy resin (N,N,N',N'-tetraglycidyl-4,4'-methylenebisbenzenamine) having an average epoxy equivalent of 100 to 300 was added to the prepared silica slurry and stirred at 300 rpm and room temperature so as to be dissolved, thereby preparing a mixture. Then, 5 g of amino triazine novolac curing agent represented by Chemical Formula 1 was added to the mixture and additionally stirred for 1 hour at 300 rpm, thereby preparing a resin composition. The prepared resin composition was applied onto a shiny surface of a copper foil at a thickness of 100 μm in a doctor blade scheme. The manufactured film was dried at room temperature for 2 hours, dried in a vacuum oven at 80° C. for 1 hour, and then dried at 110° C. for 1 hour, thereby obtaining a B-stage film. The obtained B-stage film was completely cured using a vacuum press. In this case, the maximum temperature was 230° C., and the maximum pressure was 2 MPa.

Evaluation of Thermal Properties

Coefficients of thermal expansion (CTE) of the samples of the insulating films manufactured in Examples 1 and 2, and Comparative Examples 1 and 2 were measured using a thermo-mechanical analyzer (TMA), and glass transition temperatures (Tg) thereof were measured using TA instruments (TMA 2940) under a nitrogen atmosphere while raising a temperature at a rate of 10° C./min to 270° C. (first cycle) and 300° C. (second cycle) by differential scanning calorimetry (DSC). The obtained results were shown in the following Table 1.

Evaluation of Peel Strength Property of Copper Foil

After a copper foil having a width of 1 cm was peeled off from a surface of the copper clad laminate, the peel strength of the copper foil was measured using a universal testing machine (UTM, KTW 100). The obtained results were shown in the following Table 1 (90 degree peel off test, crosshead rate: 50 mm/min).

TABLE 1

| | Coefficient of thermal expansion (ppm/° C.) | Glass transition temperature (° C.) | Peel strength (T) (kN/m) |
|---|---|---|---|
| Example 1 | 50.1 | 215 | 1.0 or more |
| Example 2 | 51.2 | 212 | 1.0 or more |
| Comparative Example 1 | 54.8 | 205 | 0.92 |
| Comparative Example 2 | 65.0 | 170 | 0.91 |

It may be appreciated that the insulating films of Examples 1 and 2 in which the phenolic curing agent having five or more functional groups was used had the coefficient of thermal expansion (CTE) lower and the glass transition temperature (Tg) higher than those of the insulating film of Comparative Example 1 in which the dicyandiamide curing agent was used. The peel strength may also be improved. Further, although compared with the insulating film of Comparative Example 2 in which the phenolic curing agent having five or more functional groups was used without the liquid crystal oligomer, it may be appreciated that the insulating film of Example 1 had more improved thermal properties.

As set forth above, the resin composition for a printed circuit board according to the present invention, and the insulating film and the prepreg manufactured using the same may have low coefficient of thermal expansion, excellent heat resistance property, and a high glass transition temperature.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A resin composition for a printed circuit board, the resin composition comprising:
   a liquid crystal oligomer represented by the following Chemical Formula 4 or 5;
   an epoxy resin; and
   a phenolic curing agent having five or more functional groups and represented by the following Chemical Formula 1,

[Chemical Formula 1]

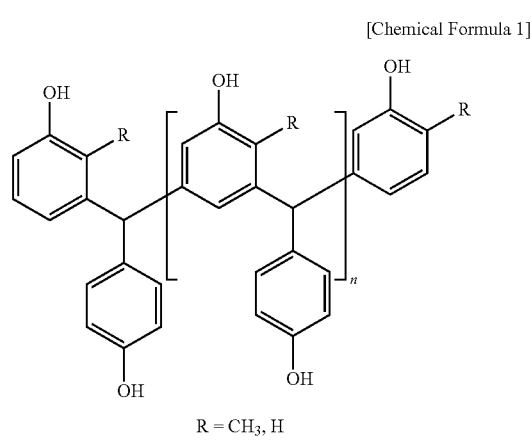

R = CH₃, H n is an integer of 1 to 10,

[Chemical Formula 4]

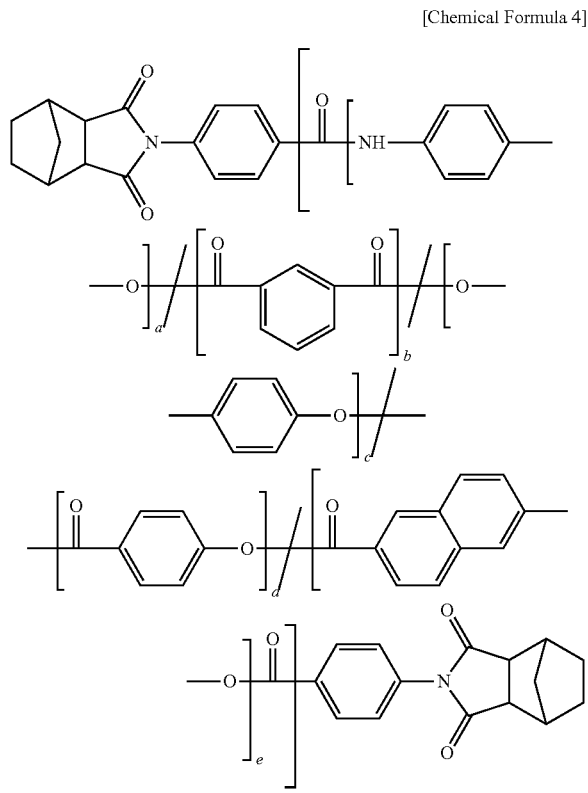

[Chemical Formula 5]

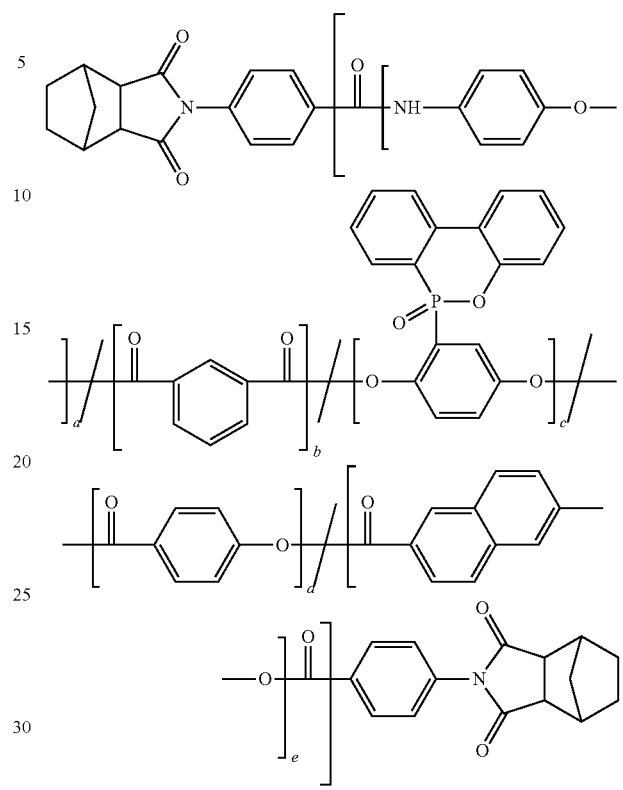

wherein in Chemical Formulas 4 and 5, a is an integer of 13 to 26, b is an integer of 13 to 26, c is an integer of 9 to 21, d is an integer of 10 to 30, and e is an integer of 10 to 30.

2. The resin composition as set forth in claim 1, further comprising an inorganic filler.

3. The resin composition as set forth in claim 1, wherein it contains 39 to 60 weight % of the liquid crystal oligomer, 39 to 60 weight % of the epoxy resin, and 0.1 to 1 weight % of the phenolic curing agent having five or more functional groups.

4. The resin composition as set forth in claim 2, wherein it contains 9 to 30 weight % of the liquid crystal oligomer, 9 to 30 weight % of the epoxy resin, 0.01 to 0.5 weight % of the phenolic curing agent having five or more functional groups, and 50 to 80 weight % of the inorganic filler.

5. The resin composition as set forth in claim 1, wherein the liquid crystal oligomer has a number average molecular weight of 2,500 to 6,500.

6. The resin composition as set forth in claim 1, wherein the epoxy resin is at least one selected from a naphthalene type epoxy resin, a bisphenol A type epoxy resin, a phenol novolac epoxy resin, a cresol novolac epoxy resin, a rubber modified epoxy resin, and a phosphorous type epoxy resin.

7. The resin composition as set forth in claim 1, wherein the epoxy resin has four or more epoxy functional groups.

8. The resin composition as set forth in claim 2, wherein the inorganic filler is at least one selected from a group consisting of silica, alumina, barium sulfate, talc, clay, mica powder, aluminum hydroxide, magnesium hydroxide, calcium carbonate, magnesium carbonate, magnesium oxide, boron nitride, aluminum borate, barium titanate, calcium titanate, magnesium titanate, bismuth titanate, titanium oxide, barium zirconate, calcium zirconate.

9. The resin composition as set forth in claim 1, further comprising at least one curing accelerator selected from a metal based curing accelerator, an imidazole based curing accelerator, and an amine based curing accelerator.

10. The resin composition as set forth in claim 1, further comprising at least one thermoplastic resin selected from a phenoxy resin, a polyimide resin, a polyamideimide (PAT) resin, a polyetherimide (PEI) resin, a polysulfone (PS) resin, a polyethersulfone (PES) resin, a polyphenyleneether (PPE) resin, a polycarbonate (PC) resin, a polyetheretherketone (PEEK) resin, a polyester resin.

11. An insulating film made of the resin composition as set forth in claim 1.

12. A prepreg manufactured by impregnating the resin composition as set forth in claim 1 into a base.

13. A printed circuit board comprising the insulating film as set forth in claim 11.

14. A printed circuit board comprising the prepreg as set forth in claim 12.

* * * * *